United States Patent
Nagata

(10) Patent No.: US 7,146,550 B2
(45) Date of Patent: Dec. 5, 2006

(54) ISOLATION TESTING CIRCUIT AND TESTING CIRCUIT OPTIMIZATION METHOD

(75) Inventor: Eiji Nagata, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 184 days.

(21) Appl. No.: 10/792,809

(22) Filed: Mar. 5, 2004

(65) Prior Publication Data

US 2004/0181720 A1    Sep. 16, 2004

(51) Int. Cl.
*G01R 31/28* (2006.01)
*G06F 17/50* (2006.01)

(52) U.S. Cl. .............................. 714/726; 716/2; 716/4
(58) Field of Classification Search .................... None
See application file for complete search history.

(56) References Cited

U.S. PATENT DOCUMENTS

| | | | | |
|---|---|---|---|---|
| 5,504,756 A | * | 4/1996 | Kim et al. | 714/729 |
| 5,907,562 A | * | 5/1999 | Wrape et al. | 714/726 |
| 5,983,377 A | * | 11/1999 | Knotts | 714/726 |
| 6,518,788 B1 | | 2/2003 | Kasahara | |
| 6,734,693 B1 | | 5/2004 | Nakayama | |

FOREIGN PATENT DOCUMENTS

| | | |
|---|---|---|
| JP | 5-087890 | 4/1993 |
| JP | 7-294604 | 11/1995 |
| JP | 8-320802 | 12/1996 |
| JP | 11-344534 | 12/1999 |
| JP | P2000-172736 A | 6/2000 |
| JP | P2001-144183 A | 5/2001 |
| JP | P2001-267510 A | 9/2001 |
| JP | 2002-83000 A | 3/2002 |
| JP | 2004-111561 A | 4/2004 |

* cited by examiner

*Primary Examiner*—Christine T. Tu
(74) *Attorney, Agent, or Firm*—McDermott Will & Emery LLP

(57) ABSTRACT

In order to avoid generation of a routing complexity of LSI and a signal rounding due to insertion of the isolation testing circuit, if a plurality of IPs are incorporated into LSI, the present invention provides an isolation testing circuits having test switching selectors 731 to 736 for selecting any one of a test input signal (or a test input transit signal) and a normal input signal, and test signal transit buffers 721 to 726 for relaying the test input signal (or the test input transit signal) are formed in respective IP blocks 701 to 706 incorporated into an LSI. Adjacent isolation testing circuits are connected mutually based on a floor plan or layout placement information such that a wiring length of a test input signal 709 and test input transit signals 710 to 714, which are connected in a single stroke of a pen, can be reduced shortest.

3 Claims, 7 Drawing Sheets

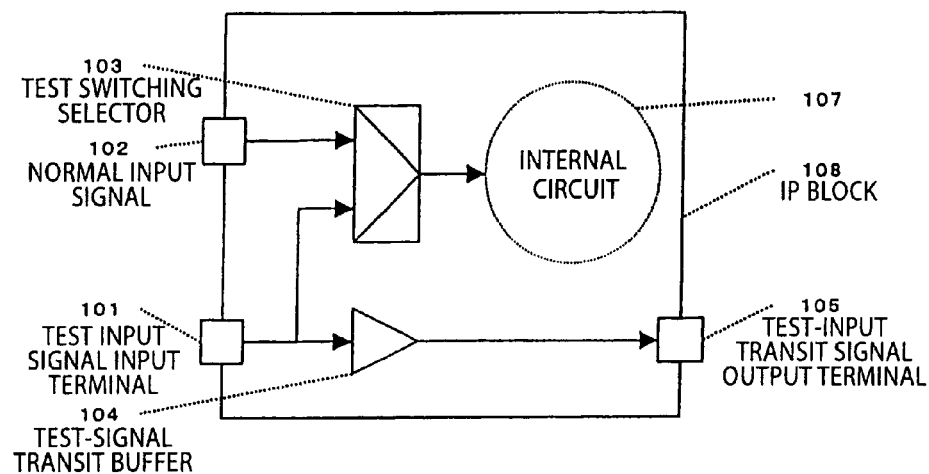
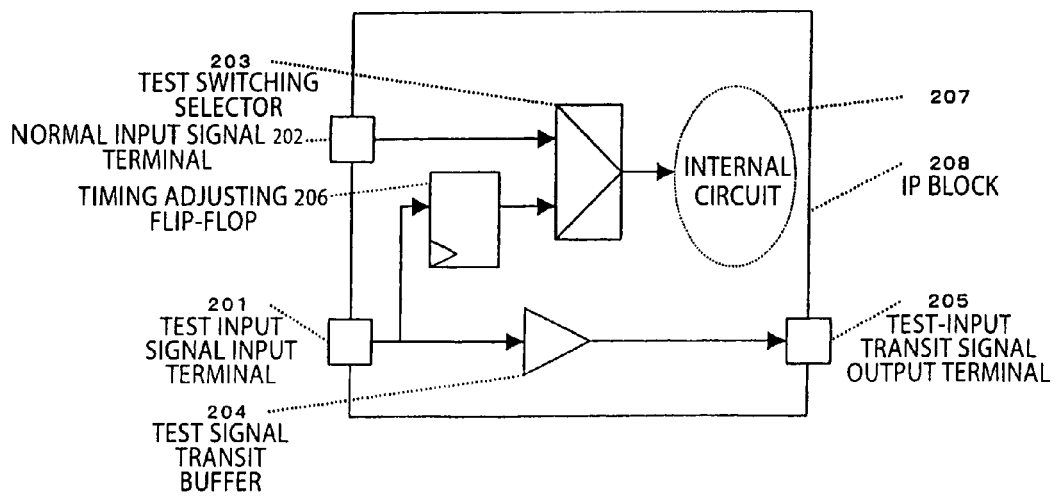

ISOLATION TESTING CIRCUIT AND TESTING CIRCUIT OPTIMIZATION METHOD

BACKGROUND OF THE INVENTION

1. Field of the Invention

The present invention relates to an isolation testing circuit and a testing circuit optimization method for executing an isolation test of a plurality of IPs incorporated into an LSI.

2. Description of the Related Art

The number of IPs incorporated into the LSI becomes huge nowadays pursuant to the larger scale of the LSI. In order to check functions of incorporated IPs, the isolation testing circuit for leading input/output terminals of respective IPs to external terminal of the LSI must be inserted. Since the input/output terminals of respective IPs are connected to share the external terminal of the LSI, the external terminal of the LSI and respective IPs are connected via enormous wirings. In this case, the related art concerned with the IP test is disclosed in Patent Reference 1(JP-A-2001-267510), and so forth.

FIG. 10 is a configurative view of LSI showing an isolation testing circuit configuration in the related art. In FIG. 10, a test input signal 1009 input from the external device via a test input terminal 1007 is connected to IP blocks 1001 to 1006 incorporated into the LSI via one wiring respectively. Also, test output signals 1017 to 1022 of respective IP blocks 1001 to 1006 are connected to a test output terminal 1015 via a test switching selector 1037 in such a manner that all wirings are converged into the test output terminal 1015. Such wirings are inserted as many as the number of the test input signals used in the isolation test.

However, according to the method in the related art, a large number of wirings that are extended from the external terminal to respective IPs in a one-to-multiple fashion and wirings that are converged into one location must be inserted. As a result, problems such as a routing complexity, a signal rounding, etc. were caused in a layout design of LSI, so that a floor plan of LSI often failed and an increase of a chip size and a delay of a development term were brought about.

SUMMARY OF THE INVENTION

The present invention has been made to overcome the above problems in the related art, and it is an object of the present invention to provide an isolation testing circuit and a testing circuit optimization method capable of avoiding generation of a routing complexity of LSI and a signal rounding due to insertion of the isolation testing circuit, in the LSI into which a plurality of IPs are incorporated.

In order to achieve this object, an isolation testing circuit set forth in Claim 1 provides an isolation testing circuit added to an IP (internal circuit 107) that is incorporated into an LSI (IP block 108), which comprises a test switching selector (test switching selector 103) for selecting a test input signal (test input signal 101) or a normal input signal (normal input signal 102) to input into the IP; and a test-signal transit buffer (test-signal transit buffer 104) for obtaining a test input transit signal that relays the test input signal to propagate to another IP.

According to the above configuration, the overall testing circuit can be constructed in such a manner that the test input signal is propagated as the test input transit signal through respective IP blocks to which the isolation testing-circuit is added. Therefore, the wirings of the test input signal are never provided to extend from one terminal to a plurality of IPs in a one-to-multiple fashion. As a result, the routing complexity caused by the test input signal can be relaxed and also the signal rounding of the test input signal can be suppressed because the signal is relayed by the test signal transit buffer.

In the isolation testing circuit set forth in Claim 1, the isolation testing circuit according to claim 2 further comprises a timing adjusting flip-flop (timing adjusting flip-flop 206) for adjusting a delay time of the test input signal; wherein the test switching selector selects the test input signal a timing of which is adjusted or the normal input signal.

According to the above configuration, in addition to the effect of the isolation testing circuit set forth in Claim 1, since the test input signal is input into the IP via the timing adjusting flip-flop, a delay time of the test input signal due to the propagation can be adjusted. Therefore, the influence of the delay of the test input signal can be eliminated, and a stable testing can be implemented.

An isolation testing circuit set forth in Claim 3 provides an isolation testing circuit added to an IP (internal circuit 307) that is incorporated into an LSI (IP block 308), which comprises a test switching selector (test switching selector 303) for selecting an external test output signal (external test output signal 301) or an internal test output signal (internal test output signal 302) to output to another IP.

According to the above configuration, the overall testing circuit can be constructed in such a manner that the test output signal is propagated through respective IP blocks to which the isolation testing circuit is added. Therefore, a large number of wirings of the test output signal are never converged into one location of the LSI, and the routing complexity caused by the test output signal can be relaxed A testing circuit optimization method set forth in Claim 4 provides a testing circuit optimization method of an LSI into which a plurality of IPs to which the isolation testing circuit set forth in Claim 1 or Claim 2 or Claim 3 or having an equivalent function is added are incorporated, which comprises the step of executing a testing-circuit adjacent connecting process of connecting adjacent isolation testing circuits sequentially in a single stroke of a pen based on floor plan information of the LSI before a layout placing process is executed.

According to the above configuration, the isolation testing circuits inserted into respective IP blocks can be connected mutually via the shortest wiring in a single stroke of the pen. Therefore, the routing complexity caused by the test input signal or the test output signal can be relaxed and the signal rounding of the test input signal or the test output signal can be suppressed.

A testing circuit optimization method set forth in Claim 5 provides a testing circuit optimization method of an LSI into which a plurality of IPs to which the isolation testing circuit set forth in Claim 1 or Claim 2 or Claim 3 or having an equivalent function is added are incorporated, which comprises the step of executing a testing-circuit adjacent connecting process of connecting adjacent isolation testing circuits sequentially in a single stroke of a pen based on actual placement information of the LSI after a layout placing process is executed.

According to the above configuration, the isolation testing circuits inserted into respective IP blocks can be connected mutually via the shortest wiring in a single stroke of the pen to take account of actual positional relationships of respective IP blocks. Therefore, the routing complexity caused by the test input signal or the test output signal can be relaxed and the signal rounding of the test input signal or the test output signal can be suppressed.

A testing circuit optimization method set forth in Claim 6 provides a testing circuit optimization method of an LSI into which a plurality of IPs to which the isolation testing circuit set forth in Claim 1 or Claim 2 or Claim 3 or having an equivalent function is added are incorporated, which comprises the steps of removing wirings provided by a testing-circuit adjacent connecting process using the testing circuit optimization method set forth in Claim 4 after a layout placing process is executed by using a net list that is formed by applying the testing circuit optimization method set forth in Claim 4; and executing a testing-circuit adjacent reconnecting process of connecting adjacent isolation testing circuits sequentially in a single stroke of a pen based on actual placement information after the layout placing process is executed.

According to the above configuration, the isolation testing circuits inserted into respective IP blocks can be connected mutually, then these wirings are removed after the layout placing process, and then respective signals are connected once again via the shortest wiring in a single stroke of the pen to take account of actual positional relationships of respective IP blocks. Therefore, the implementation and the layout of the testing circuits can be achieved such that the routing complexity caused by the test input signal or the test output signal can be reduced at its maximum and the signal rounding of the test input signal or the test output signal can be suppressed.

BRIEF DESCRIPTION OF THE DRAWINGS

FIG. 1 is a block diagram showing a configuration of an isolation testing circuit in a first embodiment of the present invention;

FIG. 2 is a block diagram showing a configuration of an isolation testing circuit in a second embodiment of the present invention;

Figure 3:
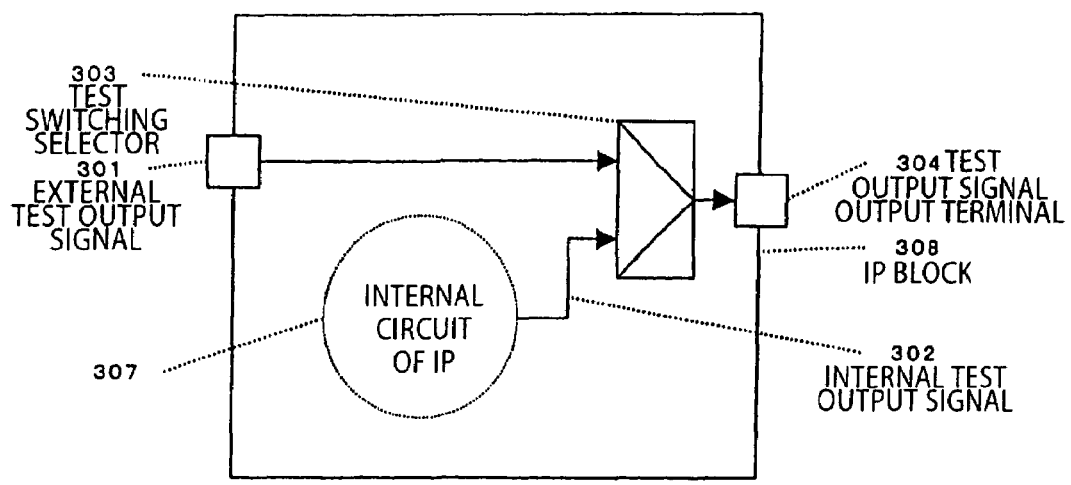
FIG. 3 is a block diagram showing a configuration of an isolation testing circuit in a third embodiment of the present invention.

In the drawings, a reference numeral 101, 201 refers to a test input signal input terminal; 102, 202 to a normal input signal input terminal; 103, 203, 303 to a test switching selector; 104, 204 to a test signal transit buffer; 105, 205 to a test input transit signal output terminal; 206 to a timing adjusting flip-flop; 107, 207, 307 to an internal circuit; 108, 208, 308 to an IP block; 301 to an external test output signal input terminal; 302 to an internal test output signal; 304 to a test output signal output terminal; 401, 601, 901 to an initial net-list inputting step; 402, 602, 902 to an isolation testing-circuit inserting step; 403, 903 to a floor-plan block placement information extracting step; 405, 605, 905 to a testing-circuit adjacent connecting step; 406, 606, 906 to a testing-circuit connected net-list generating step; 607 to a testing-circuit inserted net-list generating step; 408, 608, 908 to a layout placing step; 909 to a testing-circuit wiring cutting step; 610, 910 to a layout placement information extracting step; 911 to a testing-circuit adjacent reconnecting step; 912 to a testing-circuit reconnected net-list generating step; 413, 613, 913 to a layout routing step; 501 to 506, 701 to 706 to an IP block; 801 to 806, 1001 to 1006 to an IP block; 507, 707, 1007 to a test input terminal; 508, 708, 1008 to a test input terminal x; 509, 709, 1009 to a test input signal; 510 to 514, 710 to 714 to a test input transit signal; 515, 815 to a test output terminal; 516, 816 to a test output terminal y; 517 to 522, 817 to 822 to a test output signal; 721 to 726 to a test signal transit buffer; and 731 to 736, 831 to 836 to a test switching selector.

DETAILED DESCRIPTION OF THE PREFERRED EMBODIMENTS

Isolation testing circuits and testing circuit optimization methods according to embodiments of the present invention will be explained with reference to the drawings hereinafter.

FIG. 1 is a block diagram showing a configuration of an isolation testing circuit in a first embodiment of the present invention. In FIG.1, 101 is a test input signal input terminal, 102 is a normal input signal input terminal, 103 is a test switching selector, 104 is a test-signal transit buffer, 105 is a test-input transit signal output terminal, 107 is an internal circuit of IP installed into the IP block, and 108 is an IP block.

In the IP block 108, any one of a test input signal from the test input signal input terminal 101 and a normal input signal from the normal input signal input terminal 102 is selected by the test switching selector 103 and then input into the internal circuit 107. Also, a test input signal is transited through the test-signal transit buffer 104 and then output from the test-input transit signal output terminal 105 to the outside.

Since the isolation testing circuit shown in FIG. 1 is formed in each IP block incorporated into the LSI and these circuits are connected in compliance with a testing circuit optimization method described later, an optimum isolation testing circuit can be constructed in the LSI. As a result, the routing complexity caused by the test input signal can be relaxed and the signal rounding of the test input signal can be suppressed.

FIG. 2 is a block diagram showing a configuration of an isolation testing circuit in a second embodiment of the present invention. In FIG. 2, 201 is a test input signal input terminal, 202 is a normal input signal input terminal, 203 is a test switching selector, 204 is a test signal transit buffer, 205 is a test-input transit signal output terminal, 206 is a timing adjusting flip-flop, 207 is an internal circuit of IP installed in the IP block, and 208 is an IP block.

In the IP block 208, a test input signal from the test input signal input terminal 201 is input into the timing adjusting flip-flop 206 to eliminate the influence of the delay, and then one of an output of the timing adjusting flip-flop 206 and a normal input signal from the normal input signal input terminal 202 is selected by the test switching selector 203 and then input into the internal circuit 207. Also, a test input signal is transited through the test-signal transit buffer 204 and then output from the test-input transit signal output terminal 205 to the outside.

Since the isolation testing circuit shown in FIG. 2 is formed in each IP block incorporated into the LSI and these circuits are connected in compliance with a testing circuit optimization method described later, an optimum isolation testing circuit can be constructed in the LSI. As a result, the routing complexity caused by the test input signal can be relaxed and the signal rounding of the test input signal can be suppressed. In addition, the influence of the delay of the test input signal can be eliminated, and a stable testing can be implemented.

FIG. 3 is a block diagram showing a configuration of an isolation testing circuit in a third embodiment of the present invention. In FIG. 3, 301 is an external test output signal input terminal, 302 is an internal test output signal, 303 is a test switching selector, 304 is a test output signal output terminal, 307 is an internal circuit of IP installed in the IP block, and 308 is an IP block.

In the IP block 308, one of an external test output signal from the external test output signal input terminal 301 and the internal test output signal 302 output from the internal circuit 307 is selected by the test switching selector 303 and then output from the test output signal output terminal 304.

Since the isolation testing circuit shown in FIG. 3 is formed in each IP block incorporated into the LSI and these circuits are connected in compliance with a testing circuit optimization method described later, an optimum isolation testing circuit can be constructed in the LSI. As a result, the routing complexity caused by the test output signal can be relaxed and the signal rounding of the test output signal can be suppressed.

Figure 4:
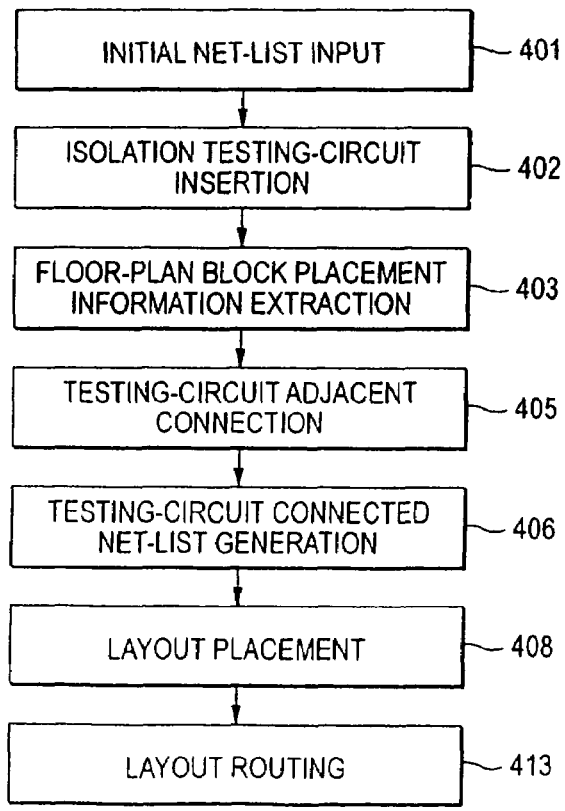
FIG. 4 is a view showing steps of a testing circuit optimization method in a fourth embodiment of the present invention.
Figure 5:
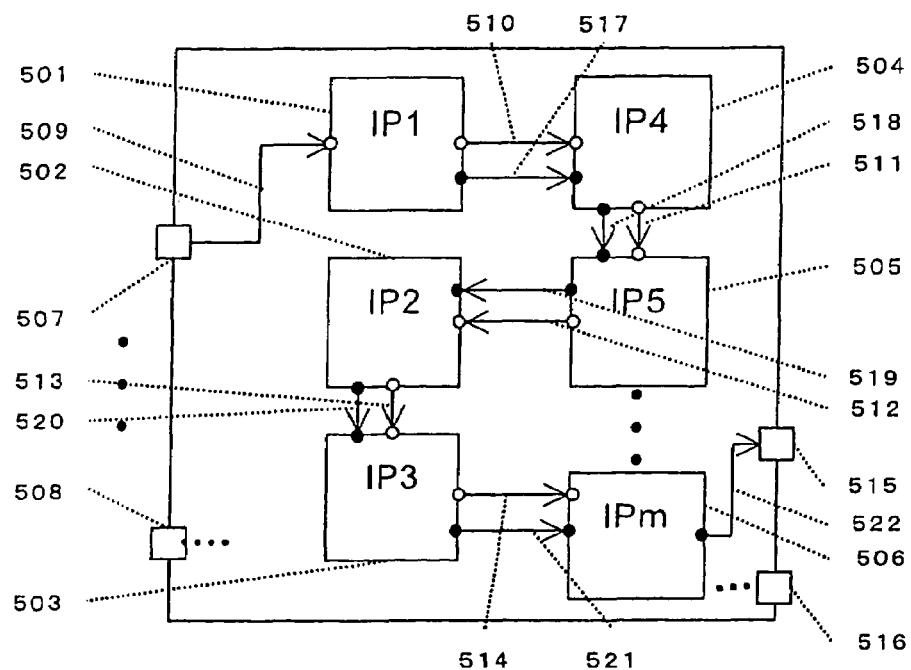
FIG. 5 is a configurative view showing an isolation testing circuit of LSI, to which the testing circuit optimization method in the fourth embodiment of the present invention is applied.

FIG. 4 is a view showing steps of a testing circuit optimization method in a fourth embodiment of the present invention. FIG. 5 is a configurative view showing an isolation testing circuit of LSI, to which the testing circuit optimization method in the fourth embodiment of the present invention is applied.

In FIG. 5, 501 to 506 are IP blocks, 507 is a test input terminal, 508 is an x-th test input terminal, 509 is a test input signal, 510 to 514 are test input transit signals, 515 is a test output terminal, 516 is a y-th test output terminal, and 517 to 522 are test output signals.

In the present embodiment, first, in step 401, an initial net-list used to layout the LSI is input. Then, in step 402, the isolation testing circuits shown in FIG. 1 and FIG. 2 and FIG. 3 are inserted into respective IP blocks 501 to 506.

Then, in step 403, floor-plan block placement information are extracted to connect mutually the isolation testing circuits inserted into respective IP blocks. Then, in step 405, a testing-circuit adjacent connecting process of connecting the test input signal 509, the test input transit signals 510 to 514, and the test output signals 517 to 522 in a single stroke of the pen based on the extracted information is carried out such that a wiring length can be reduced shortest with regard to positional relationships among respective IP blocks 501 to 506. Then, in step 406, the result is generated as a testing-circuit connected net-list.

In the end, in step 408, a layout placing process is carried out by using the testing-circuit connected net-list. Then, in step 413, a layout routing process is carried out, whereby the layout of the LSI into which the isolation testing circuits are incorporated is completed.

According to this, the isolation testing circuits inserted into respective IP blocks can be connected mutually via the shortest wiring in a single stroke of the pen. Therefore, the implementation and the layout of the testing circuits can be attained such that the routing complexity caused by the test input signal and the test output signal can be relaxed and the signal rounding of the test input signal and the test output signal can be suppressed.

Figure 6:
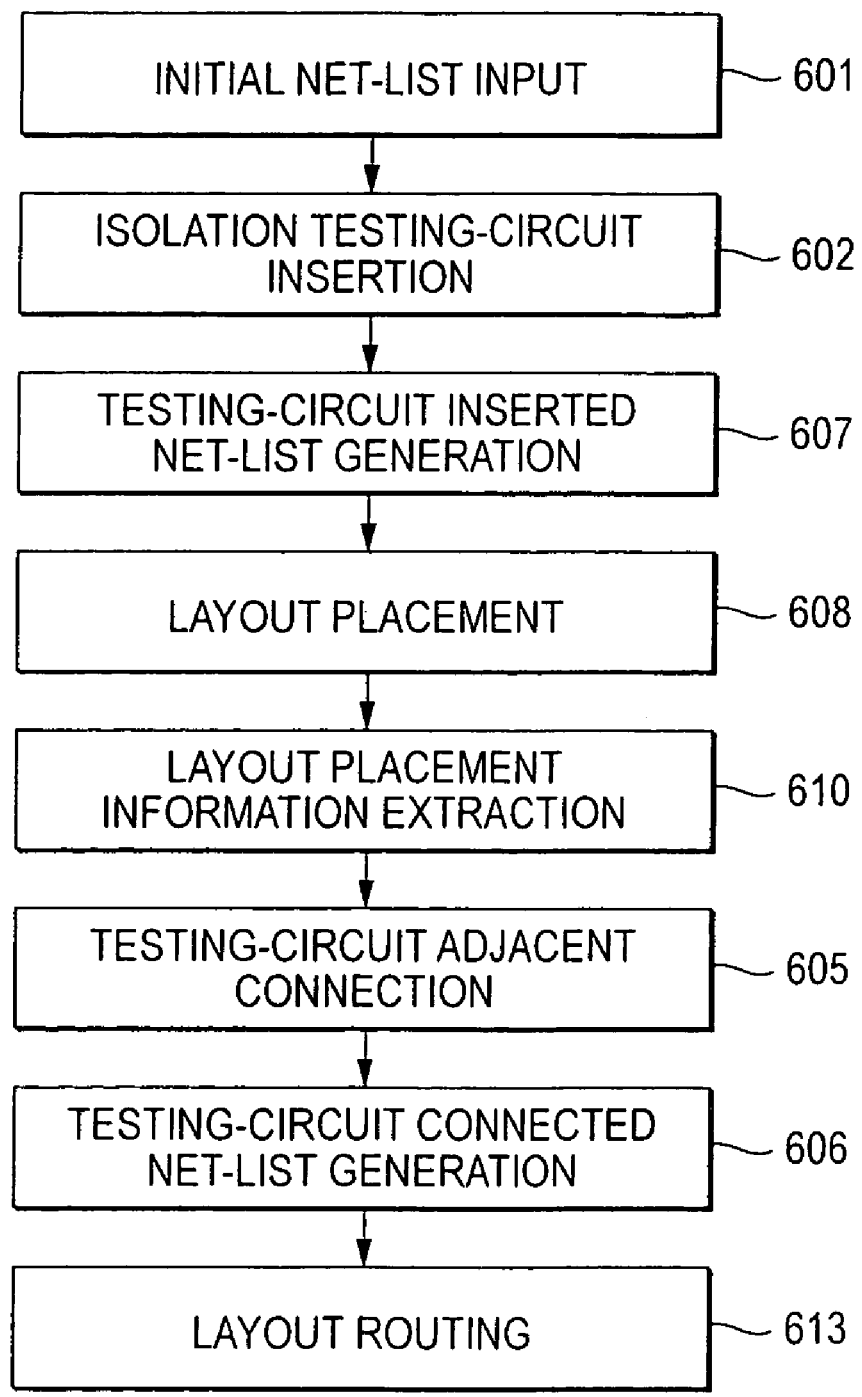
FIG. 6 is a view showing steps of a testing circuit optimization method in a fifth embodiment of the present invention.
Figure 7:
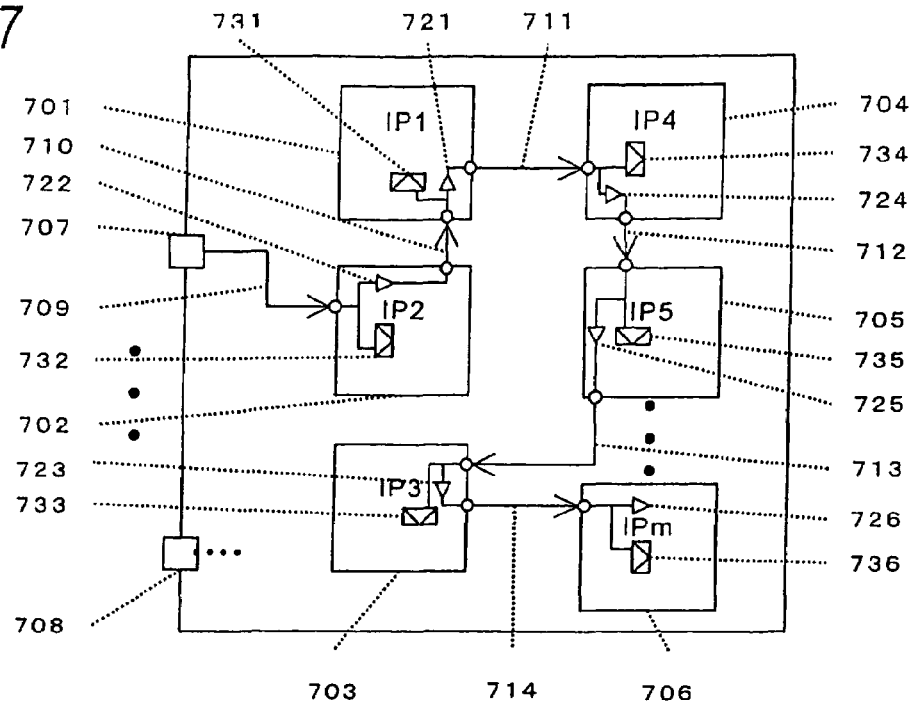
FIG. 7 is a configurative view showing an isolation testing circuit of LSI, to which the testing circuit optimization method in the fifth embodiment of the present invention is applied.
Figure 8:
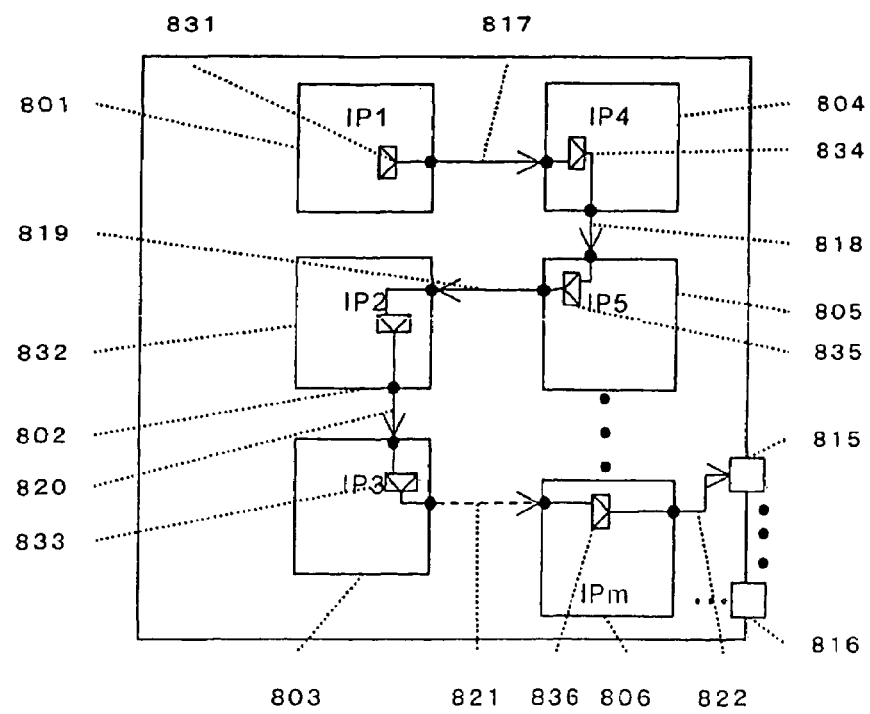
FIG. 8 is a configurative view showing an isolation testing circuit of LSI, to which the testing circuit optimization method in the fifth embodiment of the present invention is applied.

FIG. 6 is a view showing steps of a testing circuit optimization method in a fifth embodiment of the present invention. FIG. 7 and FIG. 8 are configurative views showing an isolation testing circuit of LSI, to which the testing circuit optimization method in the present embodiment of the present invention is applied, respectively.

In FIG. 7, 701 to 706 are IP blocks, 707 is a test input terminal, 708 is an x-th test input terminal, 709 is a test input signal, 710 to 714 are test input transit signals, 721 to 726 are test signal transit buffers, and 731 to 736 are test switching selectors.

In FIG. 8, 801 to 806 are IP blocks, 815 is a test output terminal, 816 is a y-th test output terminal, 817 to 822 are test output signals, and 831 to 836 are test switching selectors.

In the present embodiment, first, in step 601, an initial net-list used to layout the LSI is input. Then, in step 602, the isolation testing circuits shown in FIG. 1 and FIG. 2 and FIG. 3 are inserted into respective IP blocks 701 to 706, 801 to 806. Then, in step 607, the result is generated as a testing-circuit inserted net-list.

Then, in step 608, a layout placing process is carried out by using the testing-circuit inserted net-list. Then, in step 610, a layout placement information extraction of the test signal transit buffers 721 to 726 and the test switching selectors 731 to 736, 831 to 836 is carried out.

Then, in step 605, a testing-circuit adjacent connecting process of connecting the test input signal 709, the test input transit signals 710 to 714, and the test output signals 817 to 822 in a single stroke of the pen is carried out based on the extracted information such that a wiring length can be reduced shortest to take account of actual positional relationships among respective IP blocks. Then, in step 606, the result is generated as a testing-circuit connected net-list.

Finally, in step 613, a layout routing process is executed by using the testing-circuit connected net-list, whereby the layout of the LSI into which the isolation testing circuits are incorporated is completed According to this, the isolation testing circuits inserted into respective IP blocks can be connected mutually via the shortest wiring in a single stroke of the pen to take account of actual positional relationships of respective IP blocks. Therefore, the implementation and the layout of the testing circuits can be attained such that the routing complexity caused by the test input signal and the test output signal can be relaxed and the signal rounding of the test input signal and the test output signal can be suppressed.

Figure 9:
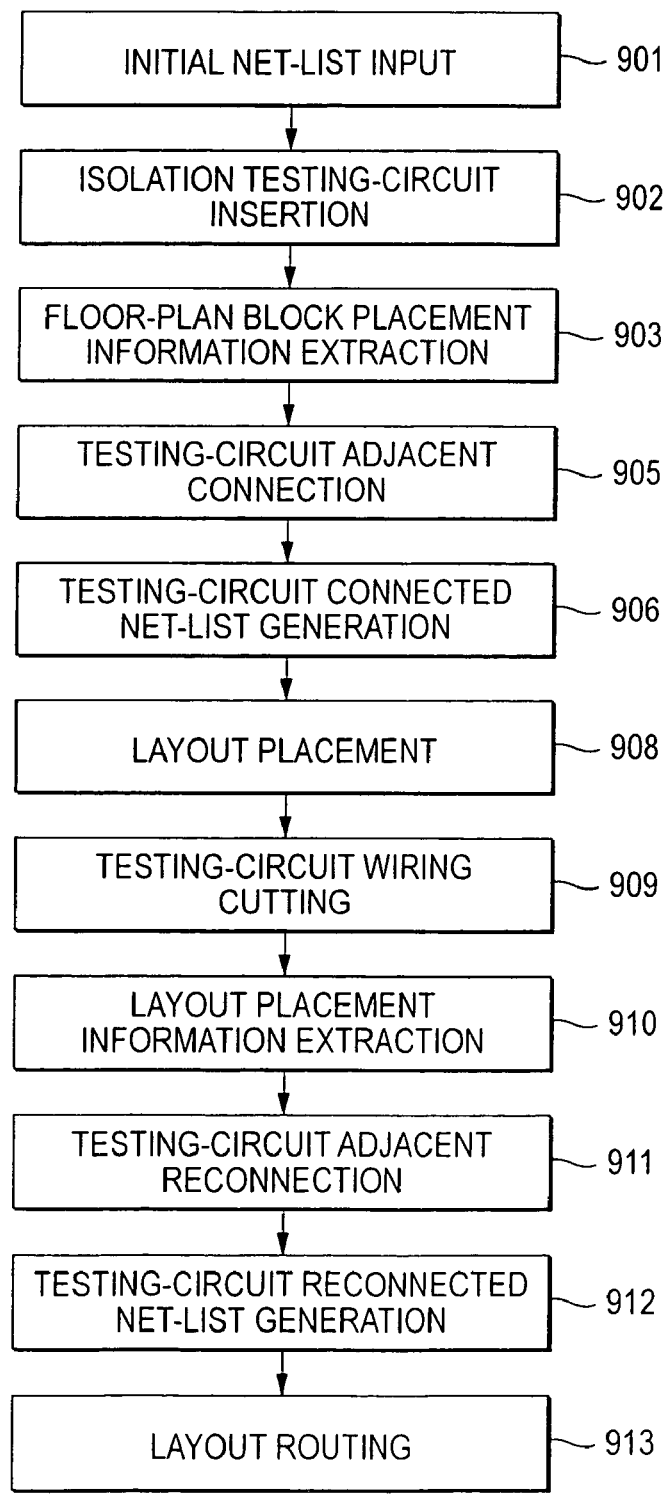
FIG. 9 is a view showing steps of a testing circuit optimization method in a sixth embodiment of the present invention.
Figure 10:
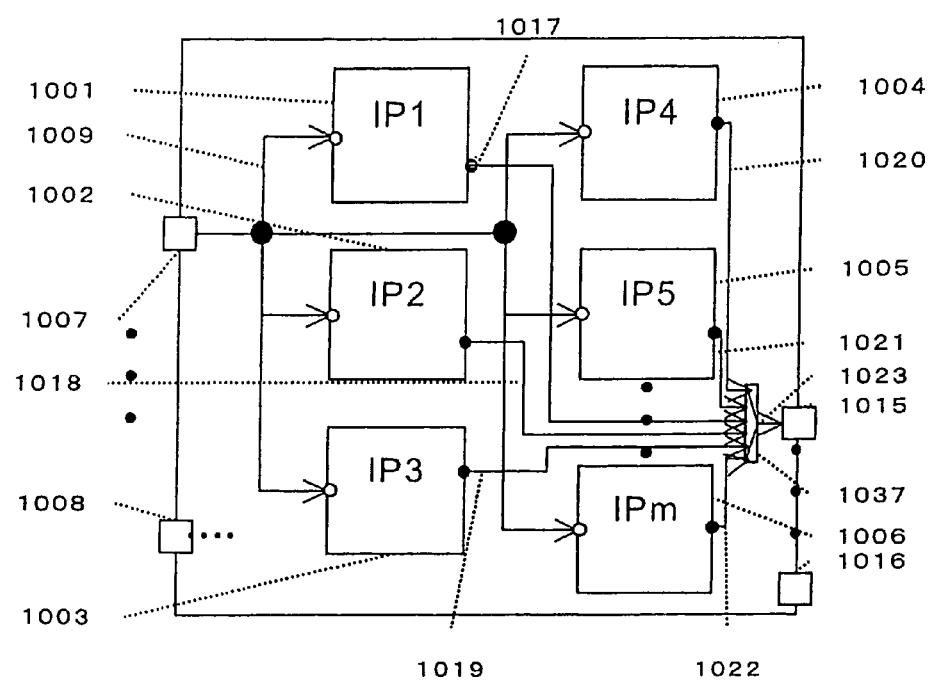
FIG. 10 is a configurative view of LSI showing an isolation testing circuit configuration in the related art.

FIG. 9 is a view showing steps of a testing circuit optimization method in a sixth embodiment of the present invention. The present embodiment will be explained with reference to the configurative views showing the isolation testing circuits of LSIs in FIG. 5 and FIG. 7 and FIG. 8 hereunder.

In the present embodiment, first, in step 901, an initial net-list used to layout the LSI is input. Then, in step 902, the isolation testing circuits shown in FIG. 1 and FIG. 2 and FIG. 3 are inserted into respective IP blocks 501 to 506 or 701 to 706 or 810 to 806.

Then, in step 903, floor-plan block placement information are extracted to connect mutually the isolation testing circuits inserted into respective IP blocks. Then, in step 905, a testing-circuit adjacent connecting process of connecting the test input signal 509, the test input transit signals 510 to 514, and the test output signals 517 to 522 in a single stroke of the pen is carried out based on the extracted information such that a wiring length can be reduced shortest with regard to positional relationships among respective IP blocks 501 to 506. Then, in step 906, the result is generated as a testing-circuit connected net-list.

Then, in step 908, a layout placing process is carried out by using the testing-circuit connected net-list. Then, in step 909, a testing-circuit wiring cutting process of removing the wirings that are provided in the testing circuit adjacent connecting process in step 905 is carried out.

Then, in step 910, extraction of layout placement information of the test signal transit buffers 721 to 726 and the test switching selectors 731 to 736, 831 to 836 is carried out. Then, in step 911, a testing-circuit adjacent reconnecting process of connecting the test input signal 709, the test input transit signals 710 to 714, and the test output signals 817 to 822 in a single stroke of the pen is carried out based on the extracted information such that a wiring length can be reduced shortest to take account of actual positional relationships among respective IP blocks. Then, in step 912, the result is generated as a testing-circuit reconnected net-list.

Here, the layout placement information extraction in step 910 may be carried out before the testing-circuit wiring cutting process in step 909 is executed. Then, in step 913, a layout routing process is executed based on the wiring connection information in the testing-circuit reconnected net-list, whereby the layout of the LSI into which the isolation testing circuits are incorporated is completed.

In this manner, the isolation testing circuits inserted into respective IP blocks can be connected mutually via the shortest wiring, then these wirings are removed after the layout placing process is done, and then respective signals are connected once again via the shortest wiring in a single stroke of the pen to take account of actual positional relationships among respective IP blocks. Therefore, the implementation and the layout of the testing circuits can be achieved such that the routing complexity caused by the test input signal and the test output signal can be further reduced and the signal rounding of the test input signal and the test output signal can be suppressed.

As explained above, according to the present invention, since the function of relaying the test input signal and the test output signal is installed into the isolation testing circuits that are added to the IP incorporated into the LSI, the overall testing circuit can be constructed in such a manner that the test input-signal and the test output signal are propagated through respective IP blocks. Therefore, the wirings of the test input signal and the test output signal are never provided to extend from one terminal to a plurality of IPs in a one-to-multiple fashion, and also a large number of wirings are never converged into one location. As a result, the routing complexity caused by the test input signal and the test output signal can be relaxed and also the signal rounding of the test input signal and the test output signal can be suppressed because these signals are relayed by the test signal transit buffer or the test switching selector.

In addition, according to the present invention, since the testing circuit optimization method of connecting the adjacent isolation testing circuits sequentially in a single stroke of the pen based on the floor plan and the layout placement information is employed, the routing complexity caused by the testing circuits can be reduced at its maximum and thus the excellent effect can be brought about on the layout of the LSI into which the isolation testing circuits are incorporated.

What is claimed is:

1. A testing circuit optimization method of an LSI into which a plurality of IPs, to which an isolation testing circuit is added are incorporated, said method comprising the steps of:
   executing a testing-circuit adjacent connecting process of connecting adjacent isolation testing circuits sequentially in a single stroke of a pen based on floor plan information of the LSI before a layout placing process is executed;
   removing wirings provided by said testing-circuit adjacent connecting process after a layout placing process is executed by using a net list; and
   executing a testing-circuit adjacent reconnecting process of connecting adjacent isolation testing circuits sequentially in a single stroke of a pen based on actual placement information after the layout placing process is executed;
   wherein said isolation testing circuit comprises:
     a test switching selector for selecting a test input signal or a normal input signal to input into the IP; and
     a test-signal transit buffer for obtaining a test input transit signal and relaying the test input signal to another IP.

2. A testing circuit optimization method of an LSI into which a plurality of IPs, to which an isolation testing circuit is added are incorporated, said method comprising the steps of:
   executing a testing-circuit adjacent connecting process of connecting adjacent isolation testing circuits sequentially in a single stroke of a pen based on floor plan information of the LSI before a layout placing process is executed;
   removing wirings provided by said testing-circuit adjacent connecting process after a layout placing process is executed by using a net list; and
   executing a testing-circuit adjacent reconnecting process of connecting adjacent isolation testing circuits sequentially in a single stroke of a pen based on actual placement information after the layout placing process is executed;
   wherein said isolation testing circuit comprises:
     a test switching selector for selecting a test input signal or a normal input signal to input into the IP;
     a test-signal transit buffer for obtaining a test input transit signal that relays the test input signal to propagate to another IP; and
     a timing adjusting flip-flop for adjusting a delay time of the test input signal;
     wherein the test switching selector selects the test input signal a timing of which is adjusted or the normal input signal.

3. A testing circuit optimization method of an LSI into which a plurality of IPs, to which an isolation testing circuit is added are incorporated, said method comprising the steps of:
   executing a testing-circuit adjacent connecting process of connecting adjacent isolation testing circuits sequentially in a single stroke of a pen based on floor plan information of the LSI before a layout placing process is executed;

removing wirings provided by said testing-circuit adjacent connecting process after a layout placing process is executed by using a net list; and executing a testing-circuit adjacent reconnecting process of connecting adjacent isolation testing circuits sequentially in a single stroke of a pen based on actual placement information after the layout placing process is executed;

wherein said isolation testing circuit comprises a test switching selector for selecting one of an internal test output signal of the IP and an external test output signal from another IP, and for outputting the selected signal.

* * * * *